United States Patent [19]

Kamiya et al.

[11] Patent Number: 4,486,811
[45] Date of Patent: Dec. 4, 1984

[54] ELECTROSTATIC PROXIMITY SWITCH

[75] Inventors: Fumio Kamiya, Kyoto; Hisatoshi Nodera, Kusatsu, both of Japan

[73] Assignee: Omron Tateisi Electronics Co., Kyoto, Japan

[21] Appl. No.: 499,731

[22] Filed: May 31, 1983

[30] Foreign Application Priority Data

May 31, 1982 [JP]  Japan .............................. 57-80132[U]

[51] Int. Cl.³ .............................................. H01G 7/00
[52] U.S. Cl. .............................. 361/280; 200/DIG. 1
[58] Field of Search ................... 361/280; 200/DIG. 1

[56] References Cited

U.S. PATENT DOCUMENTS 4,067,225  1/1978  Dorman et al. ................ 361/280 X

FOREIGN PATENT DOCUMENTS 1447046  8/1976  United Kingdom ................ 361/280

Primary Examiner—Donald A. Griffin
Attorney, Agent, or Firm—Wegner & Bretschneider

[57] ABSTRACT

The detecting electrode is composed of a single metal plate. Insulating type spacers are placed locally between the detecting electrode and the screen electrode which covers the area around the rear surface. The detecting performance is improved because no member with a high dielectric constant contacts the detecting electrode.

4 Claims, 4 Drawing Figures

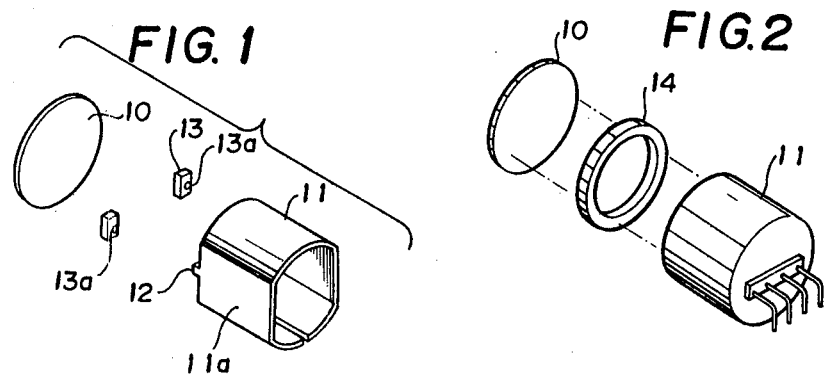
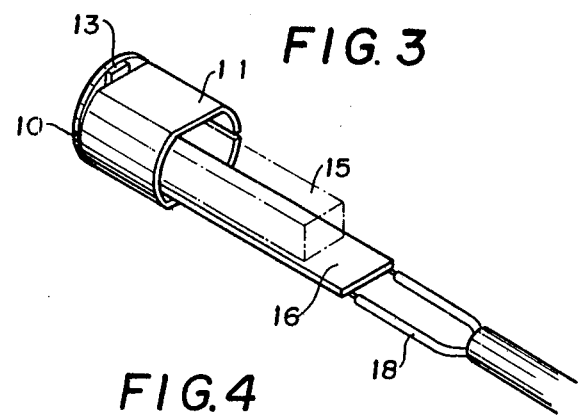
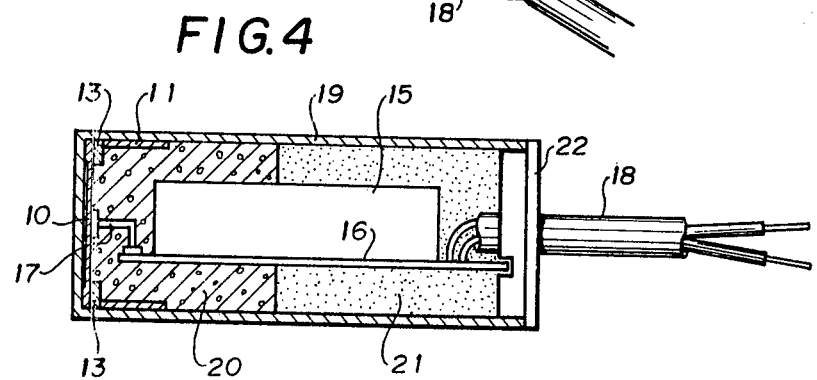

ELECTROSTATIC PROXIMITY SWITCH

BACKGROUND OF THE INVENTION

This invention is related to proximity switches which detect the proximity of objects in a state of noncontact. In more concrete terms, the invention is related to an electrostatic proximity switch which detects variations of electrostatic capacity.

There are several types of proximity switch which can be classified according to their principles of operation. One of them is the electrostatic capacity type which operates by the principle explained below. The detecting electrode is located at the front of the switch proper. When an object approaches this detecting electrode, the electrostatic capacity between the detecting element and the earth varies. This capacity variation is detected by an electric circuit and is converted into a switching signal.

Compared with with other types of proximity switches, this electrostatic proximity switch has the distinct feature that it is capable of detecting not only metals and non-metallic substances, but practically all substances including glass, wood, water, oils, plastics, etc. The detection performance of the electrostatic proximity switch is greatly influenced by the internal structure of the switch and by the electrostatic environment around the detecting electrode.

Generally, the case of a switch is of synthetic resin which is formed into a cylinder which has one end closed. The detection electrode mentioned above is installed at the inside of the closed end. The outside of the closed end of the case becomes the detecting surface towards which objects approach. To provide the detecting surface with a strong directivity, the rear of the detecting electrode is covered by a screen electrode. The section of the detecting electrode and the screen electrode is called the detecting section.

Moreover, an electric circuit which detects capacity variations and forms switching signal inputs is installed inside the case. Furthermore, the remaining space inside the case is filled with a resin such as epoxy. This resin protects the electric circuit, etc. from vibration and shields the entire case. This is the basic structure of the electrostatic proximity switch. In a conventional electrostatic proximity switch, the above detecting electrode is formed on a printed circuit board. The detecting electrode is thus a copper foil formed into the specified shape on a copper-plate laminated printed circuit board. This printed circuit is installed in the case so that its electrode formation surface is in contact with the inside surface of the case end.

A conventional printed circuit board uses a glass fiber reinforced epoxy board as a substrate. The glass fiber epoxy board has a comparatively high dielectric constant and this dielectric constance is very variable with temperature. In a conventional electrostatic proximity switch, the detecting electrode is closely attached to a substrate of unstable material which has a high dielectric constant. The above are the causes for lowering the detecting sensitivity, resolution and stability of the proximity switch itself.

In short, because the detecting electrode is attached too closely to a substrate having a high dielectric constant and which is unstable, the capacity variation due to an approaching object being tested cannot be large and consequently, high sensivility detection is not possible. Moreover, because the dielectric constant of the substrate varies widely with temperature, the rate of capacity variation caused by an approaching object is also affected greatly by temperature. Thus, high resolution cannot be made and the stability and reliability are lowered.

Also, when ceramic or Teflon is used as the substrate for printing the above detecting electrode, the dielectric constant of the above materials are comparatively stable with temperature variations and the harm of the temperature variation to the detection efficiency is comparatively little. However, even the above substrate materials have a comparatively high dielectric constant and since the detecting electrode is formed close to the substrate, the detection sensitivity and resolution cannot be raised.

BRIEF SUMMARY OF THE INVENTION

The purpose of this invention is to produce an electrostatic proximity switch which has both a high detection sensibility and resolution and which shows stable characteristics against temperature variations.

Another purpose of this invention is to realize a high performance electrostatic proximity switch such as that referred to above, and which is contained in an easy-assemble, simple structure.

To achieve the above purposes, this invention does not have the detecting electrode printed on the surface of a printed circuit board. Instead, it has the detecting electrode composed in a single unit of a metal plate. It connects this detecting electrode with a screen electrode by letting insulating spacers intervene locally and has the entire structure provided inside a plastic case.

The above are the characteristics of this invention. According to the above structure, no substance of high dielectric constant comes in close contact with the detecting electrode and so the detection sensivility, resolution and stability are improved.

Other and further objects of this invention will become obvious upon understanding of the illustrative embodiments about to be described or will be indicated in the appended claims, and various advantages not referred to herein will occur to one skilled in the art upon employment of the invention in practice.

BRIEF DESCRIPTION OF THE DRAWINGS

FIG. 1 is a drawing of the assembly of the main section of the electrostatic proximity switch.

FIG. 2 is a view of other embodiment of the electrode proximity switch.

FIG. 3 is a drawing of the assembly of the detecting electrode on which the circuit section is attached.

FIG. 4 shows the longitudinal section of the electrostatic proximity switch.

DETAILED DESCRIPTION OF THE INVENTION

FIG. 1 shows the main section of the switch, i.e. the detecting section. 10 indicates the detecting electrode which comprises the detecting section. This detecting section 10 is composed of a brass plate as well as other components.

11 shows the screen electrode obtained by processing a thin metal plate such as a brass plate on a press(winding process). This screen electrode 11 has both side sections 11a of the cylindrical side surface processed flat to form projections 12. Also, when the side sections 11a of the screen electrode 11 are so processed, the provision space of the electric circuit(electronic parts) is not harmed in any way. This is also advantageous for attaching the spacers as described later, and for soldering to detecting electrode 10. However, the above shape is not limited to the embodiment above as it can be also be cylinderical.

13, 13 are the spacers made of insulation material and which go in between said detecting electrode 10 and the screen electrode 11. This spacer 11 has a small hole 13a corresponding to said projection 12. Thus, projection 12 is inserted in the small hole 13a and temporarily connected by soldering. When the area around the hole is soldered, the sealing characteristics can be maintained. In addition, the area around the hole can be printed in advance with the cream solder and assembly can be performed as described later.

However, when spacer 13 is located between the detecting electrode 10 and the screen electrode 11, the two surfaces of spacer 13 must be plated with copper for soldering for the two surfaces to connect. Alternatively, one side of spacer 13 can be copper plated and the other surface can have adhesive applied to it, or both sides can be coated with adhesive. There are many methods. Also, the shape of the spacer between two electrodes is made small as stated previously and so its effect on the detection function can be reduced even more.

FIG. 2 shows another embodiment of this inveniton. In this case, as ring-shaped spacer is placed between the detecting electrode 10 and the cylindrical screen electrode. FIGS. 3 and 4 are drawings of the condition where the circuit section is installed on the detecting section shown above, and the longitudinal section of the electrostatic proximity switch. The detecting electrode 10 is provided with screen electrode 11 and printed circuit board 16 on which circuit section 15 is installed and is connected with terminal member 17. Then, after connecting cable 17 to printed circuit board 16, the above are inserted through the opening of the cylindrical plastic case which has a base, and installed inside plastic case 18. Next, the foaming resin 20 and the ordinary non-foaming resin 21 such as epoxy resin are inserted in the case. If a foaming resin to be used for the spacers near the detecting section has a dielectric constant of about 1/10, then the characteristics are improved greatly. Also, there are many types of foaming resins. In particular, over 50–90% of polyurethene resins are gaseous and these are effective even when used around electrode 10 since their effect on the sensitivity of the detector is minimal. In this case, the independent forming types have an excellent sealing characteristic for epoxy resin 21 and others. In addition, the hard foam resins are effective for mechnical pressure from the outside of case 19. The use of epoxy resin 21 is effective in improving the tensile strength of cable 18, and the mechanical pressure from outside. If the material of case 19 is epoxy, ABS, etc., then it is effective in adhering force, waterproofing, etc., together with the cylindrical type with base. 22 is a cover plus a cable retaining member.

As explained above, the proximity switch is composed of only metal plate such as the detecting electrode, brass plates, etc., and since the insulating spacers are placed between the metal plate and the screen electrode, the residual capacity due to the base material can be greatly reduced when compared to proximity switches using the conventional printed circuit board as a material.

Because of this, the detection variation rate of this detecting electrode can be improved and so the detection function is greatly improved in general. Moreover, because this proximity switch does not use a printed circuit board with a dielectric constant varying with temperature, it can provide a stable detection.

Also, as stated above, if the rear end of the plastic case is filled with a foaming resin and other spaces in the case are also filled with a foaming resin, then the composition and assembly of the switch become easy and the cost of manufacture can be reduced.

As many apparently widely different embodiments of this invention may be made without departing from the spirit and scope thereof, it is to be understood that the invention is not limited to the specific embodiments thereof except as difined in the appended claims.

What is claimed is:
1. An electrostatic proximity switch comprising:
A detecting electrode, a screen electrode which covers the rear of said detecting electrode and an electric circuit which detects capacity variation between said detecting electrode and the earth, are all provided in a plastic case; and
said detecting electrode is composed of a single metal plate and insulating type spacers are placed locally between the detecting electrode and said screen electrode.

2. The electrostatic proximity switch in claim 1 has the following characteristics: said screen electrode is formed into a cylindrical shape; said insulating type spacer is made up of tiny chips and these are placed as a unit between one end of said screen electrode and the rear surface of said detecting electrode.

3. The electrostatic proximity switch in claim 1 has the following characteristics: said screen electrode is formed into a cylindrical shape; and said insulating type spacer are formed into a single unit having a ring shape and are placed between one end surface and the rear surface of said detecting electrode.

4. The electrostatic proximity switch in claim 1 has the following characterisctics: a foaming resin filled into the space where said detecting electrode and said screen electrode are placed in said plastic case.

* * * * *